US009843749B2

(12) United States Patent
Lin et al.

(10) Patent No.: US 9,843,749 B2
(45) Date of Patent: Dec. 12, 2017

(54) LEAKAGE MITIGATION AT IMAGE STORAGE NODE

(71) Applicant: Sensors Unlimited, Inc., Princeton, NJ (US)

(72) Inventors: Minlong Lin, Plainsboro, NJ (US); Joshua Lund, Dallas, TX (US); John Liobe, New York, NY (US)

(73) Assignee: Sensors Unlimited, Inc., Princeton, NJ (US)

( * ) Notice: Subject to any disclaimer, the term of this patent is extended or adjusted under 35 U.S.C. 154(b) by 30 days.

(21) Appl. No.: 14/988,395

(22) Filed: Jan. 5, 2016

(65) Prior Publication Data

US 2017/0195592 A1 Jul. 6, 2017

(51) Int. Cl.

*H04N 3/14* (2006.01)
*H04N 5/359* (2011.01)
*H01L 27/146* (2006.01)
*H03K 17/14* (2006.01)
*H03K 5/08* (2006.01)
*H04N 5/3745* (2011.01)
*H04N 5/335* (2011.01)

(52) U.S. Cl.

CPC ....... *H04N 5/359* (2013.01); *H01L 27/14643* (2013.01); *H03K 5/088* (2013.01); *H03K 17/145* (2013.01); *H04N 5/37452* (2013.01)

(58) Field of Classification Search

CPC ............. H04N 5/3745; H04N 5/37452; H04N 5/3559; H04N 5/359; H01L 27/14643; H03K 5/086; H03K 5/088; H03K 17/14; H03K 17/145

USPC .................................................. 348/308–310

See application file for complete search history.

(56) References Cited

U.S. PATENT DOCUMENTS 5,214,274 A * 5/1993 Yang ......................... G01J 1/44 250/208.1
7,235,772 B2 * 6/2007 Ko .................... H01L 27/14609 250/208.1
7,547,872 B2 * 6/2009 Niclass ................... G01T 1/248 250/208.1
7,633,794 B2 12/2009 Boemler
7,839,367 B2 11/2010 Fish et al.
7,952,060 B2 * 5/2011 Watanabe ............ G09G 3/3648 250/208.1
8,063,964 B2 * 11/2011 Kozlowski ......... H04N 5/23245 250/208.1

(Continued)

FOREIGN PATENT DOCUMENTS

WO WO-2015167730 A1 11/2015

*Primary Examiner* — Ngoc-Yen Vu

(74) *Attorney, Agent, or Firm* — Locke Lord LLP; Scott D. Wofsy; Judy Naamat

(57) ABSTRACT

A leakage mitigation circuit is provided. The leakage mitigation circuit includes an inverter coupled to a storage node, wherein the storage node receives a signal output by an imaging pixel having a first voltage level to be stored. The inverter inverts the signal to a second voltage level. A single transistor coupled to the inverter and the storage node inverts the signal output by the inverter to the first level to hold the signal at the storage node to its original level. A self-biased device coupled to the inverter lowers current disturbance related to the storage node and increase threshold voltage at which fluctuation of the level of the signal at the storage node causes the signal to be inverted by the inverter.

16 Claims, 3 Drawing Sheets

(56) References Cited

U.S. PATENT DOCUMENTS

| | | | | |
|---|---|---|---|---|
| 8,089,035 | B2 * | 1/2012 | Lahav | H04N 5/35572 250/208.1 |
| 8,426,793 | B1 * | 4/2013 | Barrows | H04N 5/359 250/208.1 |
| 8,552,354 | B2 * | 10/2013 | Hirotsu | H04N 5/3559 250/208.1 |
| 8,836,680 | B2 | 9/2014 | Zebedee | |
| 8,896,512 | B2 | 11/2014 | Zebedee | |
| 2005/0219094 | A1 * | 10/2005 | Murphy | H03K 17/785 341/133 |
| 2009/0292504 | A1 * | 11/2009 | Haas | H04N 5/35509 702/179 |
| 2015/0317935 | A1 | 11/2015 | Pappas | |
| 2015/0350584 | A1 * | 12/2015 | Fenigstein | H04N 5/355 250/208.1 |
| 2015/0365615 | A1 * | 12/2015 | Oike | H04N 5/3741 348/302 |

* cited by examiner

LEAKAGE MITIGATION AT IMAGE STORAGE NODE

BACKGROUND OF THE DISCLOSURE

1. Field of the Invention

The present disclosure relates to leakage mitigation of a storage node receiving a signal from at least one imaging pixel, and more particularly to an autonomous leakage mitigation using positive feedback with minimal devices.

2. Description of Related Art

Storage nodes in imaging pixels are susceptible to leakage, particularly when storage capacitance is small and/or under certain conditions, such as when the ambient temperature is high, when the signal integration time is set long, or when the manufacturing process of an associated integrated circuit leads to the creation of devices with smaller off-resistances. Such leakage can increase the likelihood of incorrect output from the storage node.

A variety of systems and devices are known for using a positive feedback circuit in relation to leakage mitigation for a static random access memory (SRAM) device. Many such positive feedback circuits employ two inverters, where each inverter is composed of multiple electrical components. In addition, such positive feedback circuits operate in response to timing controls. Furthermore, such positive feedback circuits are susceptible to inadvertent triggering of the positive feedback circuit due to noise coupling. While use of positive feedback circuits in SRAM devices may not have protection against transient current disruptions as such transient currents may not be troublesome, other types of storage devices may be susceptible to transient current. Such vulnerable storage devices may not operate properly without adequate protection from transient current disruptions.

Such conventional methods and systems have generally been considered satisfactory for their intended purpose. However, leakage mitigation for storage nodes of imaging pixels under conditions such as when the ambient temperature is high, when the signal integration time is set long, or when the manufacturing process of an associated integrated circuit leads to the creation of devices with smaller off-resistances. In addition, there is still a need in the art for leakage mitigation for storage nodes of imaging pixels that does not rely on large storage capacity and that uses few electrical components of minimal size. Furthermore, there is a need in the art for leakage mitigation for storage nodes of imaging pixels that can operate without timing control. In addition, there is a need for improved leakage mitigation for storage nodes of imaging pixels in conditions that are susceptible to noise coupling and transient current disruptions. The present disclosure provides a solution for these problems.

SUMMARY OF THE INVENTION

The purpose and advantages of the below described illustrated embodiments will be set forth in and apparent from the description that follows. Additional advantages of the illustrated embodiments will be realized and attained by the devices, systems and methods particularly pointed out in the written description and claims hereof, as well as from the appended drawings.

To achieve these and other advantages and in accordance with the purpose of the illustrated embodiments, in one aspect, a leakage mitigation circuit is provided. The leakage mitigation circuit includes an inverter coupled to a storage node, wherein the storage node receives a signal output by an imaging pixel having a first voltage level to be stored. The inverter inverts the signal to a second voltage level. A single transistor coupled to the inverter and the storage node inverts the signal output by the inverter to the first level to hold the signal at the storage node to its original level. A self-biased device coupled to the inverter lowers current disturbance related to the storage node.

In embodiments, timing of the leakage mitigation circuit can be driven by the signal received from the imaging pixel at the storage node. The inverter can include a pair of transistors. The inverter and the single transistor can form a positive feedback circuit. The voltage level of the signal at the storage node can be unaffected by temperature. The voltage level of the signal at the storage node can be unaffected by a leakage path connected to the storage node. The voltage level of the signal at the storage node can be unaffected by manufacturing process variations associated with the leakage mitigation circuit. The self-biased device can be a single transistor. The self-biased device can limit a maximum current that can flow through the inverter. The self-biased device can increase a threshold voltage at which fluctuation of the level of the signal at the storage node causes the signal to be inverted by the inverter.

A method of mitigating leakage from a storage node of an imaging pixel includes receiving a signal output by an imaging pixel, the signal having a first voltage level to be stored, inverting the signal to a second voltage level in response to receiving the signal, and inverting, using a single electrical component, the signal to the first voltage level to hold the signal to its original level in response to inverting the signal to the second level.

In embodiments, the method can include limiting a maximum current that can flow through the inverter. In embodiments, the method can include increasing a threshold voltage at which fluctuation of the level of the signal at the storage node occurs.

In accordance with a further aspect of the disclosure, an imaging device having a focal plane array is provided. The focal plane includes an imaging pixel array and the leakage mitigation circuit.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
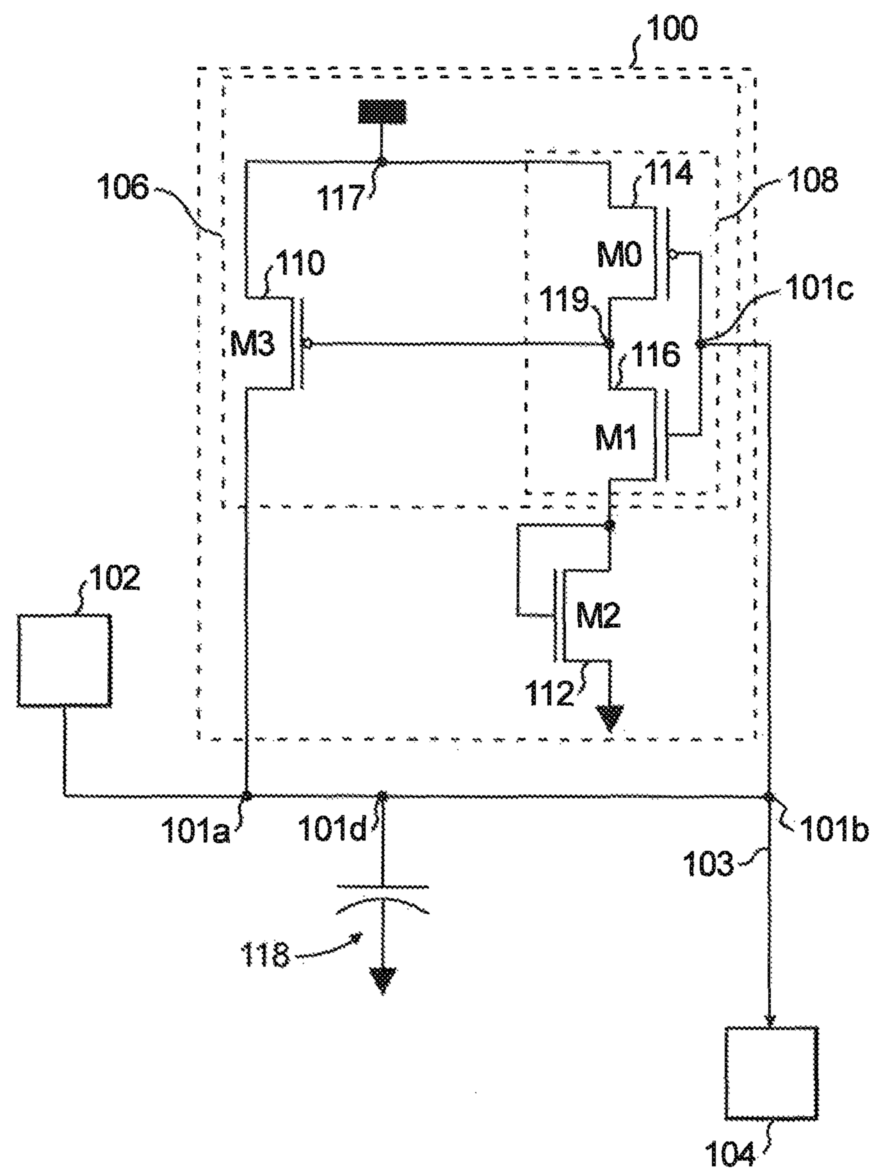
FIG. 1 is a schematic diagram of a first embodiment of a leakage mitigation circuit coupled to an imaging pixel and a leakage device in accordance with embodiments of the present disclosure.

Reference will now be made to the drawings wherein like reference numerals identify similar structural features or aspects of the subject disclosure. For purposes of explanation and illustration, and not limitation, a schematic diagram of an exemplary embodiment of a leakage mitigation circuit for a storage node in accordance with the disclosure is shown in FIG. 1 and is designated generally by reference character 100. Other embodiments of a leakage mitigation circuit in accordance with the disclosure, or aspects thereof, are provided in FIGS. 2-3, as will be described.

Embodiments of the disclosure include a leakage mitigation circuit coupled to a storage node of an imaging pixel, and methods of mitigating leakage of an output storage node of an imaging pixel.

An example leakage mitigation circuit 100 is shown in FIG. 1. Leakage mitigation circuit 100 is coupled at storage node 101*a* to an imaging pixel 102. The leakage mitigation circuit 100 is further coupled at node 101*b* to a potential leakage path 103 that leads to a leakage device 104. The leakage path 103 can be, for example, an off-state transistor channel or within the capacitor 118 itself. Capacitor 118 is composed of a dielectric that causes a finite amount of charge to flow through the capacitor and this spurious charge flow is a leakage current. The leakage device 104 can be, for example, p-n junction or a MOSFET transistor. In a MOSFET transistor, leakage manifests itself from several different mechanisms: gate leakage, subthreshold leakage, channel leakage, and gate-induced drain leakage to name a few. Of those listed above, the most predominant leakage mechanism across MOSFET technologies is subthreshold leakage from the drain to source terminals. This leakage depends on several factors, but is mostly controlled by a process parameter known as threshold voltage. Minority carriers in the channel flow even when the gate voltage is 0V in the case of N-type devices and the density of minority increases exponentially as the gate voltage approaches the threshold voltage. The leakage mitigation circuit 100 includes a positive feedback circuit 106 that includes an inverter 108 and a complementary MOSFET device 110. The positive feedback circuit 106 is coupled to a threshold control device 112, which is shown in the example to be a MOSFET device. The inverter 108 includes first and second MOSFET devices 114 and 116. A path between drains of complementary MOSFET device 110 and first MOSFET device 114 is coupled to ground at node 117. A drain of the threshold control device 112 is coupled to ground. In the example embodiment shown, complementary MOSFET device 110 and first MOSFET device 114 are PMOS devices, and threshold control device 112 and second MOSFET device 116 are NMOS devices. The configuration shown is provided by way as an example, without limitation thereto.

The storage node 101*a* is coupled to node 101*c*, which is coupled in series with node 101*a*. An optional storage capacitor 118 is provided that couples at node 101*d* to the storage node 101*a*. Nodes 101*a*, 101*b*, 101*c*, and 101*d* are all coupled in series. The capacitor 118 is coupled between node 101*d* and ground or between node 101*d* and any fixed power supply voltage. In an embodiment, nodes 101*a*, 101*b*, 101*c*, and 101*d* are connected in series without any intervening devices included in the serial path between nodes 101*a*, 101*b*, 101*c*, and 101*d*.

The storage node 101*a* receives a binary image signal output by imaging pixel 102. The image signal can have a first state in which the signal is at a first voltage level that indicates information is provided to be stored, or a second state in which the signal is at a second voltage level that indicates information is not to be stored. The objective is to store the state of the binary imaging signal has in a storage device (not shown). Without the advantage provided by the leakage mitigation circuit 100, the imaging signal at node 101*b* may leak, e.g., via leakage path 103, to a leakage device 104. The leakage can cause the voltage level of the image signal to change. The voltage level change can cause the binary signal to change its state and corrupt information indicated by the signal.

Without the advantage provided by the leakage mitigation circuit 100, the capacitor 118 does not adequately mitigate such leakage. Any leakage mitigation provided by the capacitor 118 depends on the amount of capacitance provided by the capacitor 118, such that a relatively large sized capacitor 118 is needed to provide any meaningful leakage mitigation. However, physical space can be limited, without enough physical space available to accommodate the relatively large sized capacitor 118. In addition, operation of the capacitor 118 is influenced by temperature, such that adequate leakage mitigation may not be provided at higher temperatures. In addition, the capacitor integration time may not be fast enough to mitigate leakage of a signal at nodes 101*a*, 101*b*, or 101*d* if the image signal received at node 101*a* is changing states faster than the capacitor 118 can perform integration. For example, the image signal at node 101*a* can be driven by a driver of the imaging pixel 102 that causes the image signal to change states at a speed that is faster than the capacitor 118 can perform integration.

With the advantage of the leakage mitigation circuit 100, the capacitor 118 is not required for storage. Rather, the capacitor 118 is an optional component that can improve resistance to disturbance of the state stored at nodes 101*a*, 101*b*, 101*c*, and 101*d*.

The positive feedback circuit 106 of the leakage mitigation circuit 100 is coupled to nodes 101*a* and 101*c*. Node 101*c* is coupled to gates of MOSFET devices 114 and 116 that are included in inverter 108. The image signal that arrives at node 101*c* is inverted from the first voltage level to the second voltage level, or from the second voltage level to the first voltage level. The change in voltage level causes a change of state of the image signal such that the state at a node 119, which is connected to the source of both MOSFET devices 114 and 116, is opposite the state at node 101*c*.

While the complementary MOSFET device 110 is not a full inverter, it provides an inversion function so that the state at node 101*a*, which is coupled to the source of the complementary MOSFET device 110, is the opposite of the state at node 119. Furthermore, when node 101*a* is actively driven to the opposite state, such as by the driver of imaging pixel 102, the complementary MOSFET device 110 is shut off, and a state-conflict does not exist at node 101*a*. For example, if node 101*a* is driven by the imaging pixel 102 to a "0" state, the inverter 108 inverts this state to a "1", which turns off the complementary MOSFET device 110 removing any contention between the complementary MOSFET device 110 and the imaging pixel 102. Accordingly, the state at node 101*a* is maintained until it is purposefully driven to another state, such as by the signal received at node 101*a* that is output by a driver of imaging pixel 102. Accordingly, timing of the leakage mitigation circuit can be achieved without using external control signals or timing signals. Rather, the inverter 108 inverts the signal at node 101*c* in response receipt of a signal at node 101*a*, and complementary MOSFET device 110 inverts the signal at node 119 in response to inversion by the inverter 108.

In the example embodiment shown, the state at node 101*a* remains high, which corresponds to a high voltage level until it is actively driven to a low state that corresponds to a low voltage level.

The threshold control device 112 is a self-biased device that is coupled to the inverter 108. The threshold control device 112 lowers the susceptibility of the storage node 101*a* to transient current disturbances and increases the threshold voltage at which the level of the signal at the storage node 101*a* causes the signal to be inverted by the inverter 108. Thus, the threshold control device 112 lowers susceptibility of storage node 101*a* to transient current disturbances from the inverter 108, and limits the transient current in the inverter 108 for low-power applications. In addition, the threshold control device 112 reduces inadvertent triggering of positive feedback due to noise coupling at storage node 101*a*. The components included in the leakage mitigation circuit 100, and thus the function of the leakage mitigation circuit 100, are substantially unaffected by temperature, the leakage path 103, leakage devices 104, or manufacturing process variations associated with the leakage mitigation circuit 100 or the imaging pixel 102.

Figure 2:
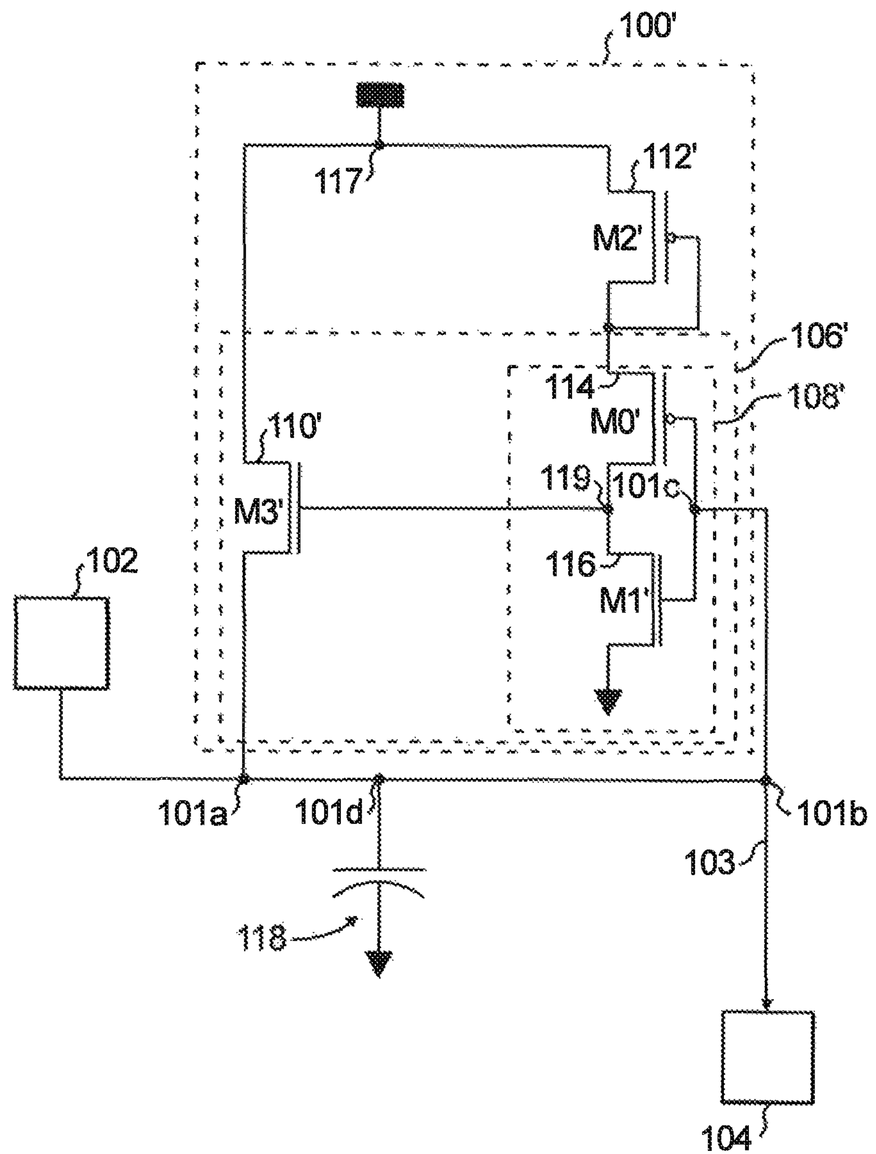
FIG. 2 is a schematic diagram of a second embodiment of a leakage mitigation circuit coupled to an imaging pixel and a leakage device in accordance with embodiments of the present disclosure.
Figure 3:
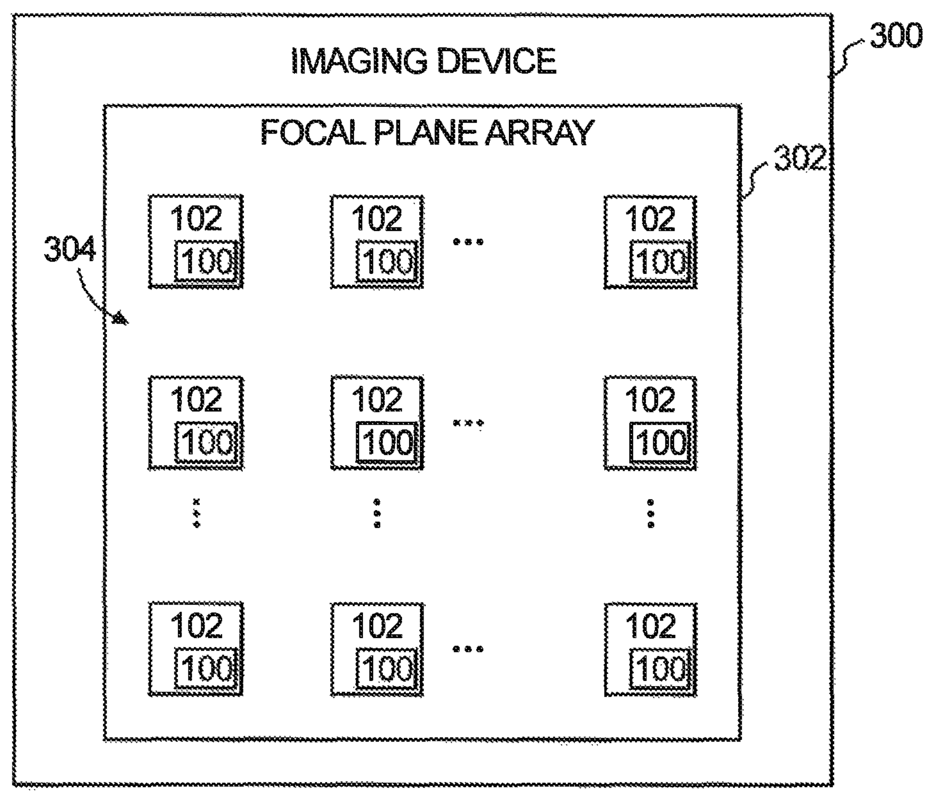
FIG. 3 is a block diagram of an imaging device that includes an array of imaging pixels having respective leakage mitigation circuits shown in FIG. 1.

With reference to FIG. 2, a second embodiment is shown of a leakage mitigation circuit 100'. Differences between the leakage mitigation circuit 100' and the leakage mitigation circuit 100 shown in FIG. 1 are described. For brevity and clarity, features that are the same as the leakage mitigation circuit 100 are not described.

In the example embodiment shown in FIG. 2, the positive feedback circuit is designated as 106', the inverter is designated as 108', the threshold control device is designated as 112', and the first and second MOSFET devices are designated as 114' and 116'. The complementary MOSFET device 110 and second MOSFET device 116 are NMOS devices, and threshold control device 112 and first MOSFET device 114 are PMOS devices. The configuration shown is provided by way as an example, without limitation thereto.

In the example embodiment shown, the state at node 101*a* remains low, which corresponds to a low voltage level, until it is actively driven to a high state that corresponds to a high voltage level.

In accordance with an embodiment, a method is provided for mitigating leakage of a storage node of an imaging pixel. The method includes receiving a signal output by an imaging pixel, the signal having a first voltage level to be stored, inverting the signal to a second voltage level in response to receiving the signal, and inverting, using a single electrical component, the signal to the first voltage level to hold the signal to its original level in response to inverting the signal to the second level. The in embodiments, the method further can include limiting a maximum current that can flow through the inverter. In addition, in embodiments, the method can include increasing a threshold voltage at which fluctuation of the level of the signal at the storage node occurs.

The methods and systems of the present disclosure, as described above and shown in the drawings provide for leakage mitigation with superior properties including a reduced number and size of devices used; immunity from fluctuations in temperature, integration time, and manufacturing process; and freedom from external timing and control signals. While the apparatus and methods of the subject disclosure have been shown and described with reference to embodiments, those skilled in the art will readily appreciate that changes and/or modifications may be made thereto without departing from the spirit and scope of the subject disclosure.

What is claimed is:

1. A leakage mitigation circuit comprising:

a leakage node coupled to a leakage path and a storage node;

an inverter coupled to the storage node, the storage node receiving a signal output by an imaging pixel having a first voltage level to be stored, the inverter inverting the signal to a second voltage level;

a single transistor coupled to the inverter and the storage node, the single transistor inverting the signal output by the inverter to the first level to hold the signal at the storage node to its original level and mitigate leakage from the storage node via the leakage path by providing positive feedback with the inverter; and a self-biased device coupled to the inverter to lower susceptibility of the storage node to current disturbance related to the storage node and increase a threshold voltage at which the level of the signal at the storage node causes the signal to be inverted by the inverter to reduce inadvertent triggering of the positive feedback provided by the inverter and the single transistor.

2. The leakage mitigation circuit of claim 1, wherein timing of the leakage mitigation circuit is driven by the signal received from the imaging pixel at the storage node.

3. The leakage mitigation circuit of claim 1, wherein the inverter includes a pair of transistors.

4. The leakage mitigation circuit of claim 1, wherein the voltage level of the signal at the storage node is minimally affected by temperature relative to leakage mitigation provided by a capacitor.

5. The leakage mitigation circuit of claim 1, wherein the voltage level of the signal at the storage node is minimally affected by the leakage path connected to the storage node relative to leakage mitigation provided by a capacitor.

6. The leakage mitigation circuit of claim 1, wherein the voltage level of the signal at the storage node is minimally affected by manufacturing process variations associated with the leakage mitigation circuit relative to leakage mitigation provided by a capacitor.

7. The leakage mitigation circuit of claim 1, wherein the self-biased device is a single transistor.

8. The leakage mitigation circuit of claim 1, wherein the self-biased device limits a maximum current that can flow through the inverter.

9. A method to mitigate leakage from a storage node of an imaging pixel, the method comprising:

receiving a signal output by an imaging pixel, the signal having a first voltage level to be stored;

inverting the signal to a second voltage level in response to receiving the signal;

providing positive feedback by the inversion of the signal to mitigate leakage via a leakage path coupled to a leakage node and a storage node; and inverting, using a single electrical component, the signal to the first voltage level to hold the signal to its original level in response to inverting the signal to the second level.

10. The method of claim 9, further comprising limiting a maximum current that can flow through the inverter.

11. An imaging device having a focal plane array comprising an imaging pixel array and a leakage mitigation circuit, the leakage mitigation circuit comprising:

a leakage node coupled to a leakage path and a storage node;

an inverter coupled to the storage node, the storage node receiving a signal output by an imaging pixel of the imaging pixel array, the signal having a first voltage level to be stored, the inverter inverting the signal to a second voltage level;

a single transistor coupled to the inverter and the storage node, the single transistor inverting the signal output by the inverter to the first level to hold the signal at the storage node to its original level and mitigate leakage from the storage node via the leakage path by providing positive feedback with the inverter; and a self-biased device coupled to the inverter to lower susceptibility of the storage node to current disturbance related to the storage node and increase a threshold voltage at which the level of the signal at the storage node causes the signal to be inverted by the inverter to reduce inadvertent triggering of the positive feedback provided by the inverter and the single transistor.

12. The leakage mitigation circuit of claim 11, wherein timing of the leakage mitigation circuit is driven by the signal received from the imaging pixel at the storage node.

13. The leakage mitigation circuit of claim 11, wherein the inverter includes a pair of transistors.

14. The leakage mitigation circuit of claim 11, wherein the voltage level of the signal at the storage node is minimally affected by at least one of temperature, the leakage path connected to the storage node, and manufacturing process variations associated with the leakage mitigation circuit relative to leakage mitigation provided by a capacitor.

15. The leakage mitigation circuit of claim 11, wherein the self-biased device is a single transistor.

16. The leakage mitigation circuit of claim 11, wherein the self-biased device limits a maximum current that can flow through the inverter.

* * * * *